(12) United States Patent
Al et al.

(10) Patent No.: US 10,784,290 B1
(45) Date of Patent: Sep. 22, 2020

(54) METHOD OF MANUFACTURING ARRAY SUBSTRATE AND ARRAY SUBSTRATE

(71) Applicant: WUHAN CHINA STAR OPTOELECTRONICS TECHNOLOGY CO., LTD., Wuhan, Hubei (CN)

(72) Inventors: Fei Al, Hubei (CN); Dewei Song, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/475,684

(22) PCT Filed: Apr. 30, 2019

(86) PCT No.: PCT/CN2019/085162
§ 371 (c)(1),
(2) Date: Jul. 3, 2019

(30) Foreign Application Priority Data

Mar. 1, 2019 (CN) .......................... 2019 1 0154264

(51) Int. Cl.
*H01L 27/12* (2006.01)
*H01L 21/768* (2006.01)
*H01L 29/66* (2006.01)
*H01L 29/786* (2006.01)

(52) U.S. Cl.
CPC ...... *H01L 27/124* (2013.01); *H01L 21/76802* (2013.01); *H01L 21/76877* (2013.01); *H01L 27/1222* (2013.01); *H01L 27/1248* (2013.01); *H01L 27/1259* (2013.01); *H01L 29/66757* (2013.01); *H01L 29/78633* (2013.01); *H01L 29/78675* (2013.01)

(58) Field of Classification Search
CPC ........... H01L 27/1229; H01L 29/66757; H01L 27/124; H01L 21/76802; H01L 29/78675; H01L 21/76877; H01L 27/1248
See application file for complete search history.

(56) References Cited

U.S. PATENT DOCUMENTS

2005/0087741 A1* 4/2005 Yamazaki ......... H01L 29/78621
257/72
2016/0370621 A1* 12/2016 Huang .................. G02F 1/1368
2017/0256569 A1* 9/2017 Ohara ................. H01L 27/1251

* cited by examiner

*Primary Examiner* — Changhyun Yi
(74) *Attorney, Agent, or Firm* — Mark M. Friedman

(57) ABSTRACT

A method of manufacturing an array substrate and an array substrate are provided. The method of manufacturing the array substrate includes forming a first metal layer on a substrate, wherein the first metal layer includes a plurality of first metal lines and a plurality of intermittent second metal lines, forming an interlayer dielectric insulating layer on the substrate and the first metal layer, and forming an intermittent data line on the interlayer dielectric insulating layer and the first metal layer, wherein the intermittent data line contacts the two ends of each of the intermittent second metal lines through the via holes.

15 Claims, 2 Drawing Sheets

METHOD OF MANUFACTURING ARRAY SUBSTRATE AND ARRAY SUBSTRATE

FIELD OF INVENTION

The present disclosure relates to the field of touch technologies, and more particularly to a method of manufacturing an array substrate and array substrate.

BACKGROUND OF INVENTION

Low temperature polysilicon display technologies can be applied to flat display devices. Due to high carrier mobility of low temperature polysilicon array substrates, transistors can achieve high switching current ratio, improve resolution and reduce power consumption, thus achieving a better visual experience.

However, current low temperature polysilicon array substrates are moving toward a trend of decreasing size, thus causing optical issues such as increased coupling capacitance and crosstalk.

Therefore, there is a need to provide a method of manufacturing an array substrate and an array substrate to solve issues of the prior art.

SUMMARY OF INVENTION

To solve the above issues, an embodiment of the present disclosure provides a method of manufacturing an array substrate. The method of manufacturing an array substrate includes providing a substrate, forming a first metal layer on the substrate, wherein the first metal layer includes a plurality of first metal lines and a plurality of intermittent second metal lines, and an extending direction of the intermittent second metal lines is perpendicular to an extending direction of the first metal lines, forming an interlayer dielectric insulating layer on the substrate and the first metal layer, patterning the interlayer dielectric insulating layer to form a plurality of via holes corresponding to two ends of each of the intermittent second metal lines, and forming an intermittent data line on the interlayer dielectric insulating layer and the first metal layer, wherein the intermittent data line contacts the two ends of each of the intermittent second metal lines through the via holes. Forming the intermittent data line on the interlayer dielectric insulating layer and the first metal layer includes forming a data line on the interlayer dielectric insulating layer and the first metal layer and etching a portion of the data line to form the intermittent data line. The portion of the data line covers the intermittent second metal lines. The extending direction of the intermittent second metal lines is parallel to an extending direction of the intermittent data line.

In an embodiment of the present disclosure, the method further includes forming a light shielding layer on the substrate and forming an active layer on the light shielding layer, a projection of the active layer disposed on the substrate is within a projection of the light shielding layer disposed on the substrate.

In an embodiment of the present disclosure, the method further includes forming a gate insulating layer on the substrate, the light shielding layer, and the active layer, the first metal layer is disposed on the gate insulating layer.

In an embodiment of the present disclosure, the method further includes patterning the interlayer dielectric insulating layer and the gate insulating layer to form a plurality of through holes, the through holes correspond to two ends of the active layer, and the intermittent data line contacts the two ends of the active layer through the through holes.

In an embodiment of the present disclosure, the method further includes sequentially forming an insulating layer, a common electrode layer, a passivation layer, and a pixel electrode layer on the interlayer dielectric insulating layer and the intermittent data line, and forming a plurality of openings on the insulating layer, the common electrode layer, and the passivation layer, the pixel electrode layer contacts the common electrode layer and the intermittent data line through the openings.

An embodiment of the present disclosure further provides a method of manufacturing an array substrate. The method of manufacturing the array substrate includes providing a substrate, forming a first metal layer on the substrate, wherein the first metal layer includes a plurality of first metal lines and a plurality of intermittent second metal lines, and an extending direction of the intermittent second metal lines is perpendicular to an extending direction of the first metal lines, forming an interlayer dielectric insulating layer on the substrate and the first metal layer, patterning the interlayer dielectric insulating layer to form a plurality of via holes corresponding to two ends of each of the intermittent second metal lines, and forming an intermittent data line on the interlayer dielectric insulating layer and the first metal layer, wherein the intermittent data line contacts the two ends of each of the intermittent second metal lines through the via holes.

In an embodiment of the present disclosure, forming the intermittent data line on the interlayer dielectric insulating layer and the first metal layer includes forming a data line on the interlayer dielectric insulating layer and the first metal layer and etching a portion of the data line to form the intermittent data line, the portion of the data line covers the intermittent second metal lines.

In an embodiment of the present disclosure, the extending direction of the intermittent second metal lines is parallel to an extending direction of the intermittent data line.

In an embodiment of the present disclosure, the method further includes forming a light shielding layer on the substrate and forming an active layer on the light shielding layer, a projection of the active layer disposed on the substrate is within a projection of the light shielding layer disposed on the substrate.

In an embodiment of the present disclosure, the method further includes forming a gate insulating layer on the substrate, the light shielding layer, and the active layer, the first metal layer is disposed on the gate insulating layer.

In an embodiment of the present disclosure, the method further includes patterning the interlayer dielectric insulating layer and the gate insulating layer to form a plurality of through holes, the through holes correspond to two ends of the active layer, and the intermittent data line contacts the two ends of the active layer through the through holes.

In an embodiment of the present disclosure, the method further includes sequentially forming an insulating layer, a common electrode layer, a passivation layer, and a pixel electrode layer on the interlayer dielectric insulating layer and the intermittent data line, and forming a plurality of openings on the insulating layer, the common electrode layer, and the passivation layer, the pixel electrode layer contacts the common electrode layer and the intermittent data line through the openings.

An embodiment of the present disclosure further provides an array substrate. The array substrate includes a substrate, a first metal layer, an interlayer dielectric insulating layer, and an intermittent data line. The first metal layer is disposed on the substrate. The first metal layer includes a plurality of first metal lines and a plurality of intermittent second metal lines, and an extending direction of the intermittent second metal lines is perpendicular to an extending direction of the first metal lines. The interlayer dielectric insulating layer is disposed on the substrate and the first metal layer. The interlayer dielectric insulating layer includes a plurality of via holes corresponding to two ends of each of the intermittent second metal lines. The intermittent data line is disposed on the interlayer dielectric insulating layer and the first metal layer. The intermittent data line contacts the two ends of each of the intermittent second metal lines through the via holes.

In an embodiment of the present disclosure, the extending direction of the intermittent second metal lines is parallel to an extending direction of the intermittent data line.

In an embodiment of the present disclosure, the array substrate further includes a light shielding layer disposed on the substrate and an active layer disposed on the light shielding layer, a projection of the active layer disposed on the substrate is within a projection of the light shielding layer disposed on the substrate.

Compared with the prior art, in order to solve the above technical problems, beneficial effects of the embodiment of present disclosure are that, the embodiment of the present disclosure provides the method of manufacturing the array substrate and the array substrate. The first metal layer includes a plurality of first metal lines and a plurality of intermittent second metal lines. The extending direction of the intermittent second metal lines is perpendicular to the extending direction of the first metal lines. The interlayer dielectric insulating layer is disposed on the substrate and the first metal layer. The interlayer dielectric insulating layer includes a plurality of via holes corresponding to two ends of each of the intermittent second metal lines. The intermittent data line is disposed on the interlayer dielectric insulating layer and the first metal layer. The intermittent data line contacts the two ends of each of the intermittent second metal lines through the via holes, such that an optical performance of the array substrate can be improved.

DETAILED DESCRIPTION OF PREFERRED EMBODIMENTS

Figure 1:
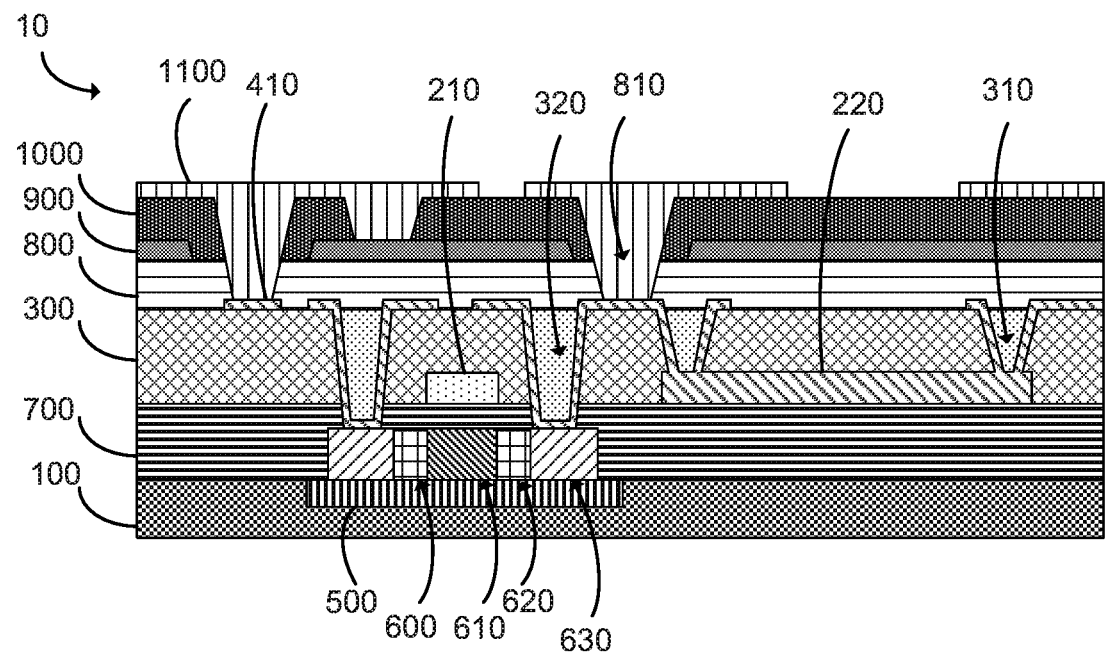
FIG. 1 is a schematic structural diagram of an array substrate according to an embodiment of the present disclosure.

The following description of the various embodiments is provided to illustrate the specific embodiments with reference to the accompanying drawings.

In order to make the above and other objects, features, and advantages of the present disclosure clearer and more obvious, preferred embodiments of the present disclosure are described below, and in conjunction with the accompanying drawings. Furthermore, the directional terms mentioned in the present disclosure, such as up, down, top, bottom, front, back, left, right, inner, outer, side, surrounding, center, level, horizontal, vertical, longitudinal, axial, radial, uppermost or lowermost, etc., only refer to the direction of the accompanying drawings. Therefore, the directional terms used are for the purpose of illustration and understanding of the present disclosure.

In the drawings, units with similar structures are labeled with the same reference number.

Figure 2:
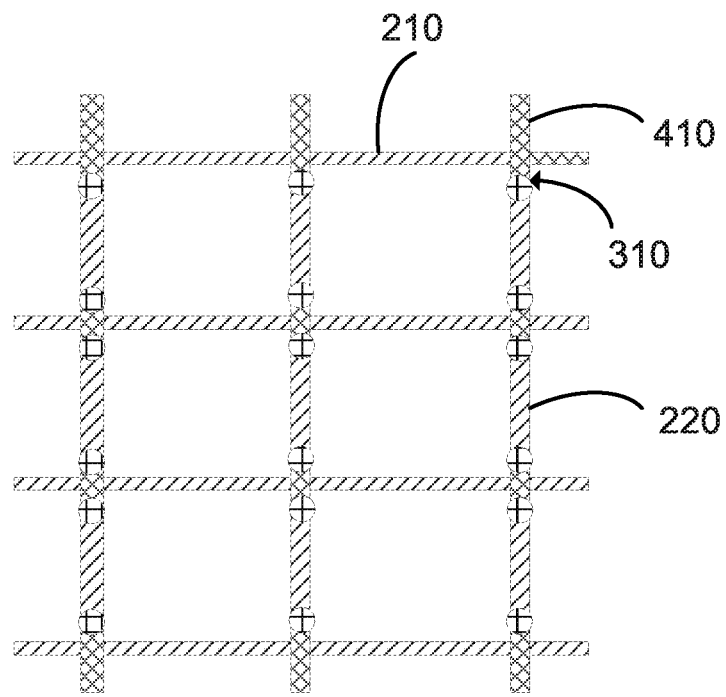
FIG. 2 is a schematic diagram of a first metal layer, an interlayer dielectric insulating layer, and an intermittent data line of an array substrate according to an embodiment of the present disclosure.
Figure 3:
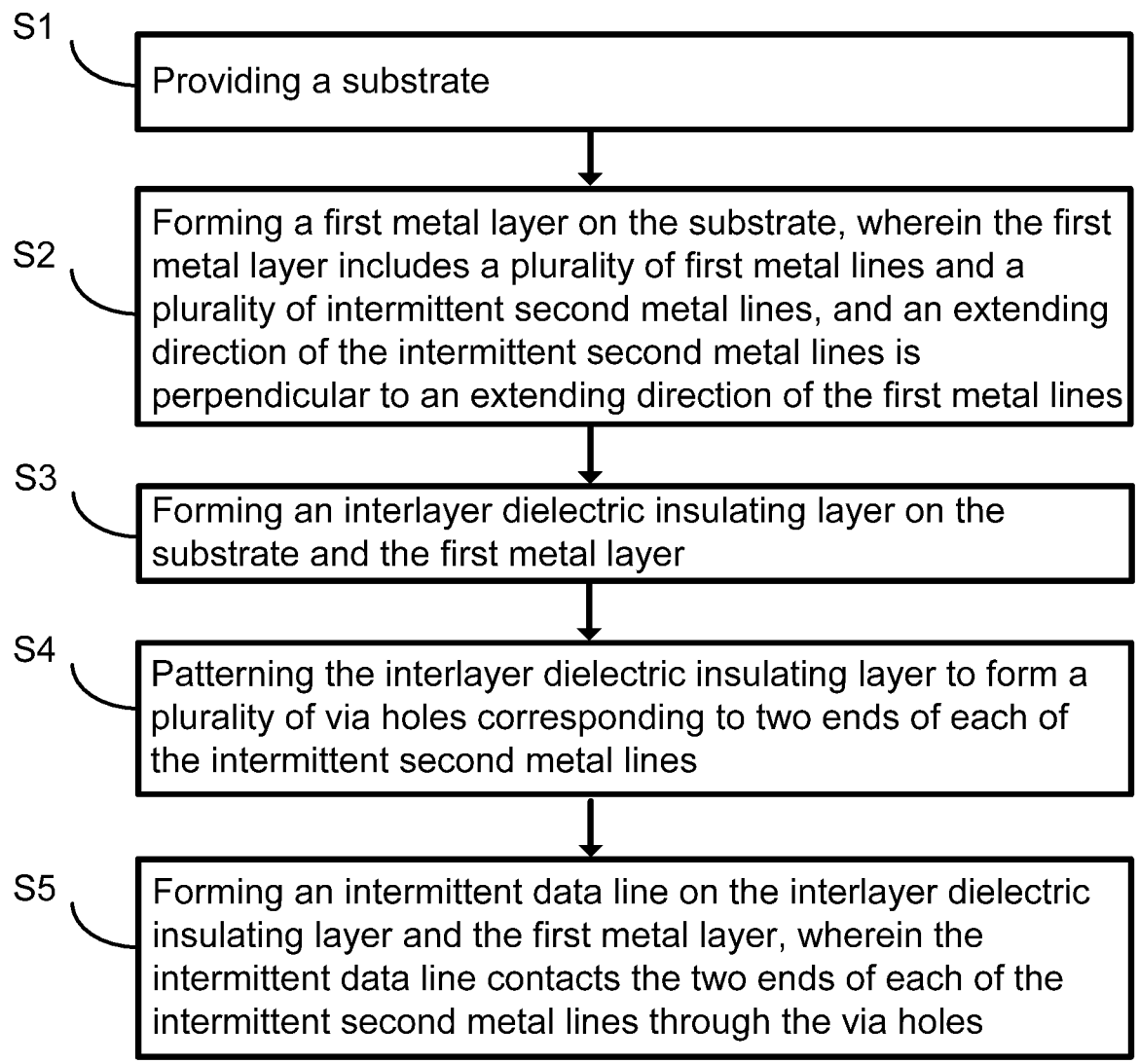
FIG. 3 is a block diagram illustrating a method of manufacturing an array substrate according to an embodiment of the present disclosure.

Referring to FIGS. 1 to 3, an embodiment of the present disclosure provides a method of manufacturing an array substrate 10. The manufacturing method of the array substrate 10 includes: a block S1, providing a substrate 100, a block S2, forming a first metal layer on the substrate 100, wherein the first metal layer includes a plurality of first metal lines 210 and a plurality of intermittent second metal lines 220, and an extending direction of the intermittent second metal lines 220 is perpendicular to an extending direction of the first metal lines 210, a block S3, forming an interlayer dielectric insulating layer 300 on the substrate 100 and the first metal layer, a block S4, patterning the interlayer dielectric insulating layer 300 to form a plurality of via holes 310 corresponding to two ends of each of the intermittent second metal lines 220, and a block S5, forming an intermittent data line 410 on the interlayer dielectric insulating layer 300 and the first metal layer, wherein the intermittent data line 410 contacts the two ends of each of the intermittent second metal lines 220 through the via holes 310.

In details, the array substrate 10 is, for example, a low temperature polysilicon array substrate. In details, forming the intermittent data line 410 on the interlayer dielectric insulating layer 300 and the first metal layer includes forming a data line on the interlayer dielectric insulating layer 300 and the first metal layer and etching a portion of the data line to form the intermittent data line 410, the portion of the data line covers the intermittent second metal lines 220. In details, the extending direction of the intermittent second metal lines 220 is parallel to an extending direction of the intermittent data line 410.

In an embodiment of the present disclosure, the method of manufacturing the array substrate 10 further includes forming a light shielding layer 500 on the substrate 100 and forming an active layer 600 on the light shielding layer 500, a projection of the active layer 600 disposed on the substrate 100 is within a projection of the light shielding layer 500 disposed on the substrate 100. In an embodiment of the present disclosure, the method of manufacturing the array substrate 10 further includes forming a gate insulating layer 700 on the substrate 100, the light shielding layer 500, and the active layer 600, the first metal layer is disposed on the gate insulating layer 700.

In details, an area of the active layer 600 corresponding to the first metal line 210 is a first area 610. An area next to the first area 610 of the active layer 600 is a second area 620. An area next to the second area 620 of the active layer 600 is a third area 630. The second area 620 is, for example, an N– doped area. The third area 620 is, for example, an N+ doped area.

In an embodiment of the present disclosure, the method of manufacturing the array substrate 10 further includes patterning the interlayer dielectric insulating layer 300 and the gate insulating layer 700 to form a plurality of through holes 320, the through holes 320 correspond to two ends of the active layer 600, and the intermittent data line 410 contacts the two ends of the active layer 600 through the through holes 320.

In an embodiment of the present disclosure, the method of manufacturing the array substrate 10 further includes sequentially forming an insulating layer 800, a common electrode layer 900, a passivation layer 1000, and a pixel electrode layer 1100 on the interlayer dielectric insulating layer 300 and the intermittent data line 410, and forming a plurality of openings 810 on the insulating layer 800, the common electrode layer 900, and the passivation layer 1000, the pixel electrode layer 1100 contacts the common electrode layer 900 and the intermittent data line 410 through the openings 810.

An embodiment of the present disclosure provides the array substrate 10 with reduced coupling capacitance, the intermittent data line 410 is bridged to the two ends of the intermittent second metal lines 220 through the via holes 310 of the interlayer dielectric insulating layer 300, thereby increasing a spacing between the intermittent data line 410 and the common electrode layer 900, and reducing coupling capacitance and crosstalk between the intermittent data line 410 and the common electrode layer 900, and improving an optical performance of the array substrate 10. In addition, the array substrate 10 of one embodiment of the present disclosure saves a flat layer, and thus the array substrate 10 can be small in size and thin.

In details, the spacing between the intermittent data line 410 and the common electrode layer 900 includes, for example, thicknesses of the interlayer dielectric insulating layer 300 and the insulating layer 800.

An embodiment of the present disclosure provides the array substrate 10 with reduced coupling capacitance. The array substrate 10 is, for example, a low temperature polysilicon array substrate. The low temperature polysilicon array substrate has high carrier mobility, which enables transistors to obtain a high switching current ratio. Under a condition of satisfying a required charging current, each transistor can be smallized, this can improve a pixel transparent area, an aperture ratio, highlights, resolution, and power consumption for a better visual experience.

Referring to FIGS. 1 and 2, an embodiment of the present disclosure provides an array substrate 10. The array substrate 10 includes a substrate 100, a first metal layer, an interlayer dielectric insulating layer 300, and an intermittent data line 410. The first metal layer is disposed on the substrate 100. The first metal layer includes a plurality of first metal lines 210 and a plurality of intermittent second metal lines 220, and an extending direction of the intermittent second metal lines 220 is perpendicular to an extending direction of the first metal lines 210. The interlayer dielectric insulating layer 300 is disposed on the substrate 100 and the first metal layer. The interlayer dielectric insulating layer 300 includes a plurality of via holes 310 corresponding to two ends of each of the intermittent second metal lines 220. The intermittent data line 410 is disposed on the interlayer dielectric insulating layer 300 and the first metal layer. The intermittent data line 410 contacts the two ends of each of the intermittent second metal lines 220 through the via holes 310.

In details, the array substrate 10 is, for example, a low temperature polysilicon array substrate. In details, the extending direction of the intermittent second metal lines 220 is parallel to an extending direction of the intermittent data line 410.

In an embodiment of the present disclosure, the array substrate 10 further includes a light shielding layer 500 disposed on the substrate 100 and an active layer 600 disposed on the light shielding layer 500, a projection of the active layer 600 disposed on the substrate 100 is within a projection of the light shielding layer 500 disposed on the substrate 100.

In details, an area of the active layer 600 corresponding to the first metal line 210 is a first area 610. An area next to the first area 610 of the active layer 600 is a second area 620. An area next to the second area 620 of the active layer 600 is a third area 630. The second area 620 is, for example, an N− doped area. The third area 620 is, for example, an N+ doped area.

In an embodiment of the present disclosure, the array substrate 10 further includes a gate insulating layer 700. The gate insulating layer 700 is disposed on the substrate 100, the light shielding layer 500, and the active layer 600, and the first metal layer is disposed on the gate insulating layer 700. In an embodiment of the disclosure, the array substrate 10 further includes a plurality of through holes 320. In this embodiment, the through holes 320 can be formed in the interlayer dielectric insulating layer 300 and the gate insulating layer 700 by patterning the interlayer dielectric insulating layer 300 and the gate insulating layer 700, 320. The through holes 320 correspond to two ends of the active layer 600, and the intermittent data line 410 contacts the two ends of the active layer 600 through the through holes 320.

In an embodiment of the present disclosure, the array substrate 10 further includes an insulating layer 800, a common electrode layer 900, a passivation layer 1000, and a pixel electrode layer 1100 sequentially disposed on the interlayer dielectric insulating layer 300 and the intermittent data line 410. The array substrate 10 further includes a plurality of openings 810. The openings 810 of the embodiment can be formed in the insulating layer 800, the common electrode layer 900, and the passivation layer 1000 by patterning the insulating layer 800, the common electrode layer 900, and the passivation layer 1000. The pixel electrode layer 1100 contacts the common electrode layer 900 and the intermittent data line 410 through the openings 810.

An embodiment of the present disclosure provides the array substrate 10 with reduced coupling capacitance, the intermittent data line 410 is bridged to the two ends of the intermittent second metal lines 220 through the via holes 310 of the interlayer dielectric insulating layer 300, thereby increasing a spacing between the intermittent data line 410 and the common electrode layer 900, and reducing coupling capacitance and crosstalk between the intermittent data line 410 and the common electrode layer 900, and improving an optical performance of the array substrate 10. In addition, the array substrate 10 of one embodiment of the present disclosure saves a flat layer, and thus the array substrate 10 can be small in size and thin.

In details, the spacing between the intermittent data line 410 and the common electrode layer 900 includes, for example, thicknesses of the interlayer dielectric insulating layer 300 and the insulating layer 800.

An embodiment of the present disclosure provides the array substrate 10 with reduced coupling capacitance. The array substrate 10 is, for example, a low temperature polysilicon array substrate. The low temperature polysilicon array substrate has high carrier mobility, which enables transistors to obtain a high switching current ratio. Under a condition of satisfying a required charging current, each transistor can be smallized, this can improve a pixel transparent area, an aperture ratio, highlights, resolution, and power consumption for a better visual experience.

An embodiment of the present disclosure provides a display device. The display device includes the array substrate 10 described above. The display device is, for example, a variety of consumer electronic product such as a mobile phone, a television, a personal digital assistant, a digital camera, a notebook computer, and the like.

The embodiment of the present disclosure provides the method of manufacturing the array substrate and the array substrate. The first metal layer includes a plurality of first metal lines and a plurality of intermittent second metal lines. The extending direction of the intermittent second metal lines is perpendicular to the extending direction of the first metal lines. The interlayer dielectric insulating layer is disposed on the substrate and the first metal layer. The interlayer dielectric insulating layer includes a plurality of via holes corresponding to two ends of each of the intermittent second metal lines. The intermittent data line is disposed on the interlayer dielectric insulating layer and the first metal layer. The intermittent data line contacts the two ends of each of the intermittent second metal lines through the via holes, such that an optical performance of the array substrate can be improved.

Although the present disclosure is described via one or more embodiments, those of ordinary skill in the art can come up with equivalent variations and modifications based upon the understanding of the specification and the accompanying drawings. The present disclosure includes all such modifications and variations and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A method of manufacturing an array substrate, comprising:
   providing a substrate;
   forming a first metal layer on the substrate, wherein the first metal layer comprises a plurality of first metal lines and a plurality of intermittent second metal lines, and an extending direction of the intermittent second metal lines is perpendicular to an extending direction of the first metal lines;
   forming an interlayer dielectric insulating layer on the substrate and the first metal layer;
   patterning the interlayer dielectric insulating layer to form a plurality of via holes corresponding to two ends of each of the intermittent second metal lines; and
   forming an intermittent data line on the interlayer dielectric insulating layer and the first metal layer, wherein the intermittent data line contacts the two ends of each of the intermittent second metal lines through the via holes;
   wherein forming the intermittent data line on the interlayer dielectric insulating layer and the first metal layer comprises forming a data line on the interlayer dielectric insulating layer and the first metal layer and etching a portion of the data line to form the intermittent data line, the portion of the data line covers the intermittent second metal lines; and
   wherein the extending direction of the intermittent second metal lines is parallel to an extending direction of the intermittent data line.

2. The method according to claim 1, further comprising forming a light shielding layer on the substrate and forming an active layer on the light shielding layer, wherein a projection of the active layer disposed on the substrate is within a projection of the light shielding layer disposed on the substrate.

3. The method according to claim 2, further comprising forming a gate insulating layer on the substrate, the light shielding layer, and the active layer, wherein the first metal layer is disposed on the gate insulating layer.

4. The method according to claim 3, further comprising patterning the interlayer dielectric insulating layer and the gate insulating layer to form a plurality of through holes, wherein the through holes correspond to two ends of the active layer, and the intermittent data line contacts the two ends of the active layer through the through holes.

5. The method according to claim 4, further comprising sequentially forming an insulating layer, a common electrode layer, a passivation layer, and a pixel electrode layer on the interlayer dielectric insulating layer and the intermittent data line, and forming a plurality of openings on the insulating layer, the common electrode layer, and the passivation layer, wherein the pixel electrode layer contacts the common electrode layer and the intermittent data line through the openings.

6. A method of manufacturing an array substrate, comprising:
   providing a substrate;
   forming a first metal layer on the substrate, wherein the first metal layer comprises a plurality of first metal lines and a plurality of intermittent second metal lines, and an extending direction of the intermittent second metal lines is perpendicular to an extending direction of the first metal lines;
   forming an interlayer dielectric insulating layer on the substrate and the first metal layer;
   patterning the interlayer dielectric insulating layer to form a plurality of via holes corresponding to two ends of each of the intermittent second metal lines; and
   forming an intermittent data line on the interlayer dielectric insulating layer and the first metal layer, wherein the intermittent data line contacts the two ends of each of the intermittent second metal lines through the via holes.

7. The method according to claim 6, wherein forming the intermittent data line on the interlayer dielectric insulating layer and the first metal layer comprises forming a data line on the interlayer dielectric insulating layer and the first metal layer and etching a portion of the data line to form the intermittent data line, the portion of the data line covers the intermittent second metal lines.

8. The method according to claim 6, wherein the extending direction of the intermittent second metal lines is parallel to an extending direction of the intermittent data line.

9. The method according to claim 6, further comprising forming a light shielding layer on the substrate and forming an active layer on the light shielding layer, wherein a projection of the active layer disposed on the substrate is within a projection of the light shielding layer disposed on the substrate.

10. The method according to claim 9, further comprising forming a gate insulating layer on the substrate, the light shielding layer, and the active layer, wherein the first metal layer is disposed on the gate insulating layer.

11. The method according to claim 10, further comprising patterning the interlayer dielectric insulating layer and the gate insulating layer to form a plurality of through holes, wherein the through holes correspond to two ends of the active layer, and the intermittent data line contacts the two ends of the active layer through the through holes.

12. The method according to claim 11, further comprising sequentially forming an insulating layer, a common electrode layer, a passivation layer, and a pixel electrode layer on the interlayer dielectric insulating layer and the intermittent data line, and forming a plurality of openings on the insulating layer, the common electrode layer, and the passivation layer, wherein the pixel electrode layer contacts the common electrode layer and the intermittent data line through the openings.

13. An array substrate, comprising:
   a substrate;
   a first metal layer disposed on the substrate, wherein the first metal layer comprises a plurality of first metal lines and a plurality of intermittent second metal lines, and an extending direction of the intermittent second metal lines is perpendicular to an extending direction of the first metal lines;
   an interlayer dielectric insulating layer disposed on the substrate and the first metal layer, wherein the interlayer dielectric insulating layer comprises a plurality of via holes corresponding to two ends of each of the intermittent second metal lines; and
   an intermittent data line disposed on the interlayer dielectric insulating layer and the first metal layer, wherein the intermittent data line contacts the two ends of each of the intermittent second metal lines through the via holes.

14. The array substrate according to claim 13, wherein the extending direction of the intermittent second metal lines is parallel to an extending direction of the intermittent data line.

15. The array substrate according to claim 13, further comprising a light shielding layer disposed on the substrate and an active layer disposed on the light shielding layer, wherein a projection of the active layer disposed on the substrate is within a projection of the light shielding layer disposed on the substrate.

* * * * *